(12) United States Patent
Lee et al.

(10) Patent No.: US 12,471,311 B2
(45) Date of Patent: Nov. 11, 2025

(54) SEMICONDUCTOR FIN-LIKE FIELD-EFFECT TRANSISTOR (FinFET) DEVICE INCLUDING SOURCE/DRAIN STRUCTURE WITH BORON DOPED CAPPING LAYER

(71) Applicant: TAIWAN SEMICONDUCTOR MANUFACTURING CO., LTD., Hsinchu (TW)

(72) Inventors: Yen-Ru Lee, Hsinchu (TW); Chii-Horng Li, Hsinchu County (TW); Chien-I Kuo, Hsinchu County (TW); Heng-Wen Ting, Pingtung County (TW); Jung-Chi Tai, Taipei (TW); Lilly Su, Hsinchu County (TW); Yang-Tai Hsiao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/590,099

(22) Filed: Feb. 28, 2024

(65) Prior Publication Data
US 2024/0204084 A1    Jun. 20, 2024

Related U.S. Application Data

(60) Continuation of application No. 17/873,982, filed on Jul. 26, 2022, now Pat. No. 11,948,999, which is a
(Continued)

(51) Int. Cl.
*H10D 30/62* (2025.01)
*H10D 84/01* (2025.01)
(Continued)

(52) U.S. Cl.
CPC ......... *H10D 30/62* (2025.01); *H10D 84/0158* (2025.01); *H10D 84/038* (2025.01); *H10D 84/834* (2025.01)

(58) Field of Classification Search
CPC ............. H01L 29/785; H01L 29/66795; H01L 29/41791; H01L 21/823425;
(Continued)

(56) References Cited

U.S. PATENT DOCUMENTS

| 7,998,881 B1 | 8/2011 | Wu |
| 9,397,099 B1 | 7/2016 | Huang |

(Continued)

FOREIGN PATENT DOCUMENTS

| CN | 102386230 A | 3/2012 |
| CN | 103329274 A | 9/2013 |

(Continued)

*Primary Examiner* — Changhyun Yi
(74) *Attorney, Agent, or Firm* — Maschoff Brennan

(57) ABSTRACT

A device includes a first semiconductor fin, a second semiconductor fin, a source/drain epitaxial structure, a semiconductive cap, and a contact. The first semiconductor fin and the second semiconductor fin are over a substrate. The source/drain epitaxial structure is connected to the first semiconductor fin and the second semiconductor fin. The source/drain epitaxial structure includes a first protruding portion and a second protruding portion aligned with the first semiconductor fin and the second semiconductor fin, respectively. The semiconductive cap is on and in contact with the first protruding portion and the second protruding portion. A top surface of the semiconductive cap is lower than a top surface of the first protruding portion of the source/drain epitaxial structure. The contact is electrically connected to the source/drain epitaxial structure and covers the semiconductive cap.

20 Claims, 21 Drawing Sheets

Related U.S. Application Data continuation of application No. 16/994,531, filed on Aug. 14, 2020, now Pat. No. 11,430,878, which is a division of application No. 16/160,900, filed on Oct. 15, 2018, now Pat. No. 10,749,013, which is a continuation of application No. 14/850,726, filed on Sep. 10, 2015, now Pat. No. 10,103,249.

(51) Int. Cl.
  *H10D 84/03* (2025.01)
  *H10D 84/83* (2025.01)

(58) Field of Classification Search
  CPC ......... H01L 21/823475; H01L 27/0886; H01L 29/4232; H10D 30/62; H10D 84/834; H10D 84/038; H10D 84/0158; H10D 64/511
  See application file for complete search history.

(56) References Cited

U.S. PATENT DOCUMENTS

| | | | |
|---|---|---|---|
| 9,397,197 | B1 | 7/2016 | Guo |
| 9,627,481 | B2 | 4/2017 | Park et al. |
| 10,388,791 | B2 | 8/2019 | Kim et al. |
| 11,948,999 | B2* | 4/2024 | Lee ................ H01L 29/41791 |
| 2011/0049583 | A1 | 3/2011 | Lin et al. |
| 2011/0298058 | A1 | 12/2011 | Kawasaki et al. |
| 2012/0049294 | A1 | 3/2012 | Chen et al. |
| 2012/0153387 | A1 | 6/2012 | Murthy et al. |
| 2013/0207166 | A1* | 8/2013 | Chen ................ H01L 29/0847 257/288 |
| 2013/0277752 | A1 | 10/2013 | Glass et al. |
| 2014/0203370 | A1 | 7/2014 | Maeda et al. |
| 2014/0217517 | A1 | 8/2014 | Cai et al. |
| 2015/0035023 | A1 | 2/2015 | Kim et al. |
| 2015/0084134 | A1 | 3/2015 | Lin et al. |
| 2015/0137181 | A1 | 5/2015 | Basker et al. |
| 2015/0179645 | A1* | 6/2015 | Liao ................ H01L 29/7851 257/77 |
| 2015/0187914 | A1 | 7/2015 | Basker et al. |
| 2015/0200291 | A1 | 7/2015 | Alptekin et al. |
| 2015/0214051 | A1 | 7/2015 | Kim et al. |
| 2015/0255567 | A1 | 9/2015 | Basu et al. |
| 2015/0333061 | A1 | 11/2015 | Kim et al. |
| 2016/0027918 | A1* | 1/2016 | Kim ................ H01L 29/7848 257/401 |
| 2016/0079367 | A1 | 3/2016 | Yoo |
| 2016/0086950 | A1 | 3/2016 | Eom et al. |
| 2016/0163860 | A1* | 6/2016 | Lee ................ H10D 62/822 257/192 |
| 2016/0172357 | A1 | 6/2016 | Song |
| 2016/0197075 | A1 | 7/2016 | Li |
| 2016/0260669 | A1 | 9/2016 | Paak et al. |
| 2016/0293749 | A1* | 10/2016 | Park ................ H10D 62/115 |
| 2016/0315081 | A1 | 10/2016 | Park |
| 2017/0054003 | A1 | 2/2017 | Liao et al. |
| 2019/0326419 | A1 | 10/2019 | Peng et al. |

FOREIGN PATENT DOCUMENTS

| | | |
|---|---|---|
| CN | 104124174 A | 10/2014 |
| CN | 104347425 A | 2/2015 |
| CN | 104752229 A | 7/2015 |

* cited by examiner

SEMICONDUCTOR FIN-LIKE FIELD-EFFECT TRANSISTOR (FinFET) DEVICE INCLUDING SOURCE/DRAIN STRUCTURE WITH BORON DOPED CAPPING LAYER

PRIORITY CLAIM AND CROSS-REFERENCE

This application is a continuation application of U.S. patent application Ser. No. 17/873,982, filed Jul. 26, 2022, which is a continuation application of U.S. patent application Ser. No. 16/994,531, filed Aug. 14, 2020, now U.S. Pat. No. 11,430,878, issued Aug. 30, 2022, which is a divisional application of U.S. patent application Ser. No. 16/160,900, filed Oct. 15, 2018, now U.S. Pat. No. 10,749,013, issued Aug. 18, 2020, which is a continuation application of U.S. patent application Ser. No. 14/850,726, filed Sep. 10, 2015, now U.S. Pat. No. 10,103,249, issued Oct. 16, 2018, which is herein incorporated by reference in its entirety.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such fin-like field effect transistors (FinFETs). Advantages of FinFET devices include reducing the short channel effect and higher current flow. However, conventional FinFET devices and methods of fabricating FinFET devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
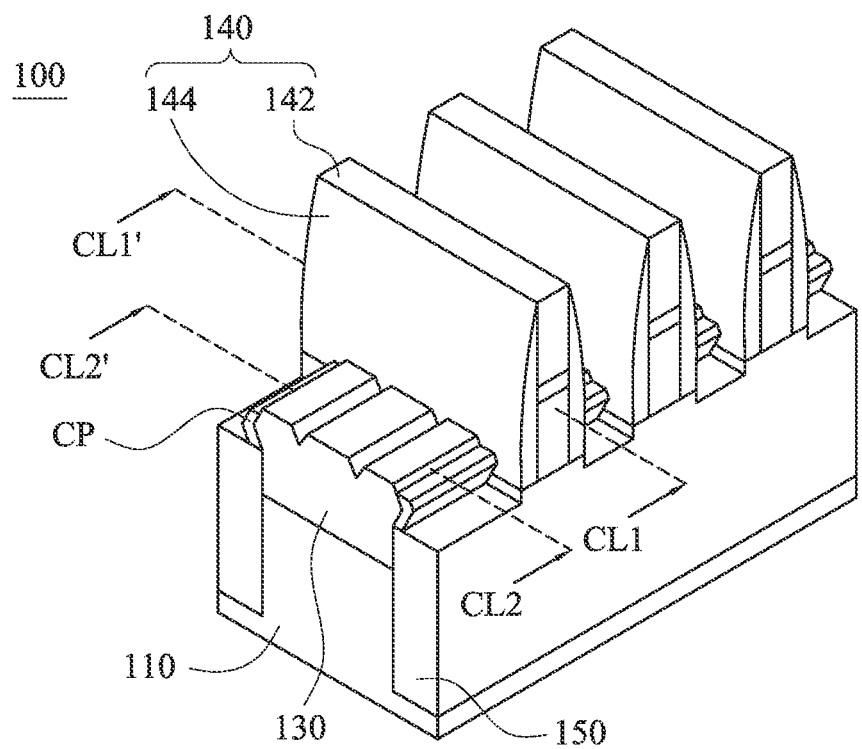
FIG. 1A is a schematic three-dimensional diagram showing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a fin-like field-effect transistor (FinFET) device. The FinFET device includes a semiconductor substrate, plural semiconductor fins on the semiconductor substrate, a source/drain structure which is located on the semiconductor substrate and connected to the semiconductor fins. The semiconductor fins are spaced apart from each other, and the source/drain structure has a top portion with a W-shape cross section for forming a contact landing region. With the W-shaped cross section, a contact area between the source/drain structure and a metal landing can be increased, and a contact area between a spacer of a gate structure and the source/drain structure can be decreased. As a result, resistance between the source/drain structure and a metal landing is decreased, and a dislocation defect induced by the spacer of the gate structure is improved. In one embodiment, the FinFET device includes capping layers located in recessed portions of the top portion, thereby reducing Schottky barrier height (SBH) and resistance between the source/drain structures and the metal landing.

Figure 1B:
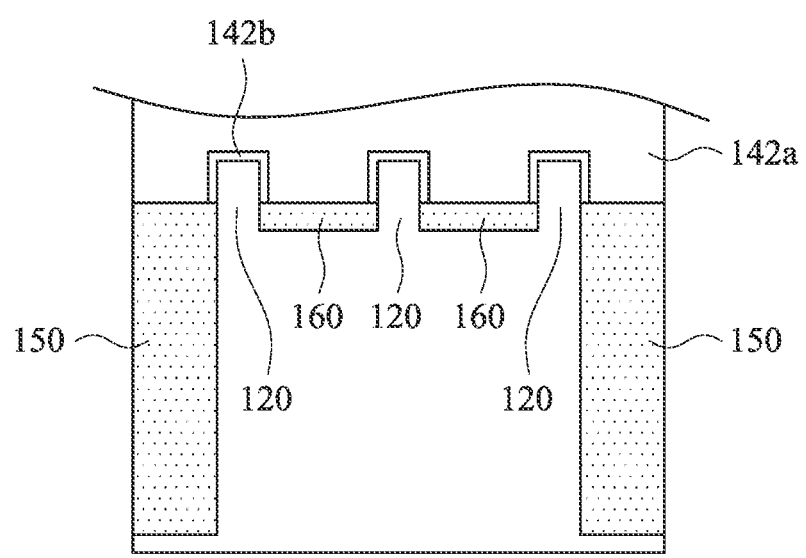
FIG. 1B is a cross-sectional view of the semiconductor device viewed along line CL1-CL1' in FIG. 1A.
Figure 1C:
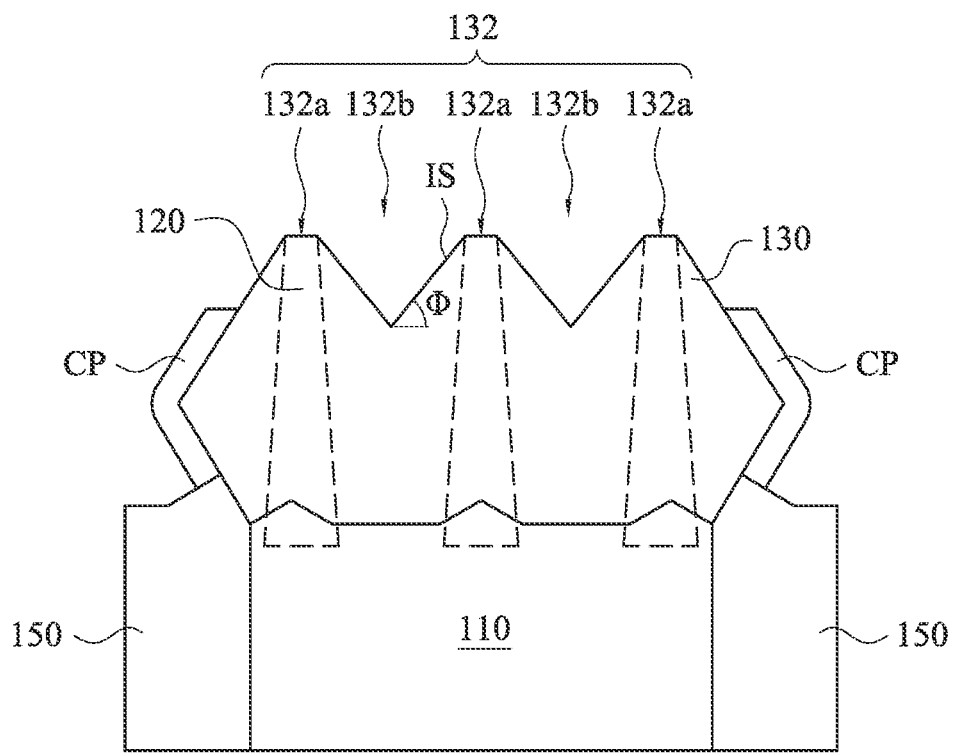
FIG. 1C is a schematic cross-sectional view of the semiconductor device viewed along line CL2-CL2' in FIG. 1A.
Figure 2:
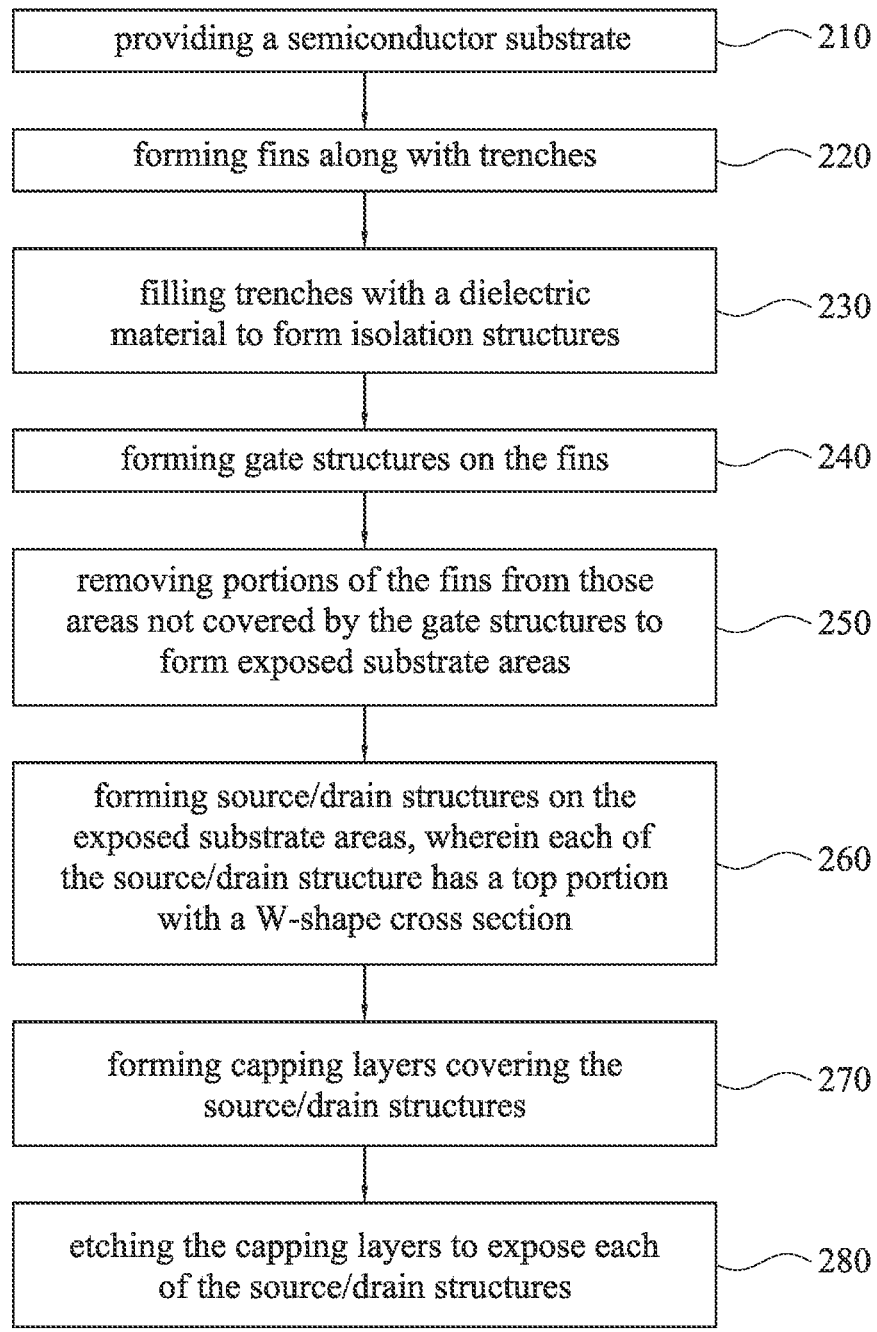
FIG. 2 is a flow chart showing a method for fabricating a semiconductor device in accordance with some embodiments of the present disclosure.

Referring to FIG. 1A through FIG. 1C, FIG. 1A is a schematic three-dimensional diagram showing a semiconductor device 100 in accordance with some embodiments of the present disclosure, FIG. 1B is a cross-sectional view of the semiconductor device 100 viewed along line CL1-CL1' in FIG. 1A, and FIG. 1C is a schematic cross-sectional view of the semiconductor device 100 viewed along line CL2-CL2' in FIG. 1A. The semiconductor device 100 includes a semiconductor substrate 110, plural fins 120 (shown in FIG. 1B), source/drain structures 130, capping layers CP, gate structures 140, isolation structures 150 and isolation structures 160 (as shown in FIG. 1B).

The substrate 110 may be a semiconductor material and may include structures including a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

The isolation structures 150 are formed in the semiconductor substrate 110. The isolation structures 150 act as a shallow trench isolation (STI) and may be formed by chemical vapor deposition (CVD) techniques using tetra-ethyl-ortho-silicate (TEOS) and oxygen as a precursor. In some embodiments, the isolation structures 150 may be formed by implanting ions, such as oxygen, nitrogen, carbon, or the like, into the semiconductor substrate 110. In other embodiments, the isolation structures 150 are insulator layers of a SOI wafer.

The fins 120, the source/drain structures 130 and the gate structures 140 are formed on the semiconductor substrate 110. The fins 120 connect the source/drain structures 130, and are enclosed by the source/drain structures 130 and the gate structures 140. Each of the gate structures 140 includes a gate electrode stack 142 and two spacers 144, and the spacers 144 are located on sidewalls of the gate electrode stack 142. In some embodiments, the gate electrode stack 142 includes a gate electrode layer 142a and a gate dielectric layer 142b, but embodiments of the present disclosure are not limited thereto.

As shown in FIG. 1B, the fins 120 protrude from the semiconductor substrate 110. The gate electrode layer 142a and the gate dielectric layer 142b of the gate electrode stack 142 are formed on the top surfaces and sidewalls of the fins 120. The isolation structures 160 (also referred to as intra-device isolation structures 160), such as STI structures, are formed between the fins 120, while the intra-device isolation structures 160 are formed to space one FinFET apart from each other. In some embodiments, the fins 120 are formed from the semiconductor substrate 110. For example, the fins 120 are formed from silicon germanium. However, the embodiments of the present disclosure are not limited thereto.

As shown in FIG. 1C, the capping layers CP are formed on sidewalls of each of the source/drain structures 130, in which structures enclosed by dotted lines represent the fins 120. A thickness of each of the capping layers CP is in a range substantially from 2 nm to 10 nm, but the embodiments of the present disclosure are not limited thereto. Further, in some embodiments, the capping layers CP include a low concentration III-V semiconductor, and are lightly impurity-doped, and the source/drain structures 130 include a high concentration III-V semiconductor and are heavily impurity-doped. For example, the capping layers CP include silicon germanium with a low germanium concentration, and are lightly boron-doped, and the source/drain structures 130 include silicon germanium with a high germanium concentration, and are heavily boron-doped. However, the embodiments of the present disclosure are not limited thereto.

Each of the source/drain structures 130 has a top portion 132 with a wavy cross section, such as a W-shape cross section. The top portion 132 has protrusive portions 132a and recessed portions 132b located between every two protrusive portions 132a. The protrusive portions 132a are corresponding to the fins 120 in a one-to-one manner. In some embodiments, heights of the protrusive portions 132a are greater than or equal to heights of the fins 120 for connecting the protrusive portions 132a with the fins 120. For each recessed portion 132b, a sidewall IS is inclined at an angle$\Phi$ relative to horizontal, the angle$\Phi$ is in a range from about 30 degrees to about 65 degrees. However, embodiments of the present disclosure are not limited thereto.

Figure 3A:
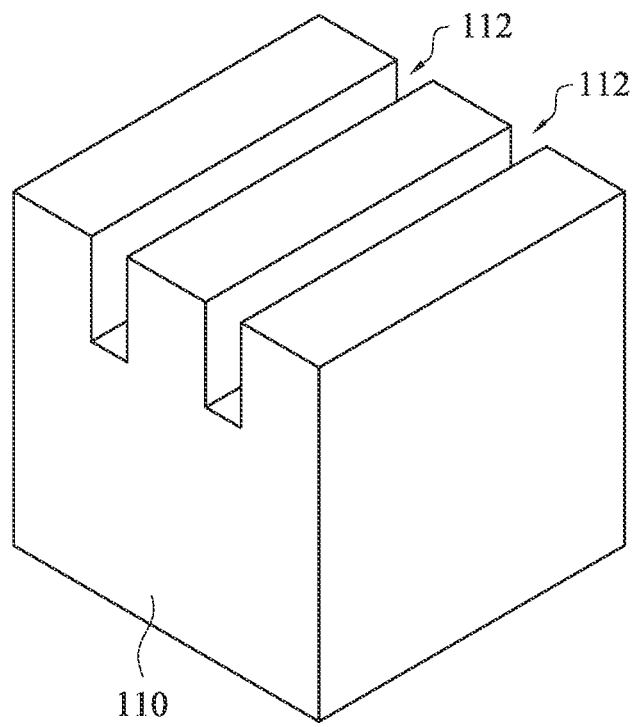
FIGS. 3A, 3B, 3C, 3D, 3E, 3F, 3G, 3H, 3I, 3J, and 3K are schematic three-dimensional diagrams and cross-sectional views of intermediate stages showing a method for fabricating a semiconductor device in accordance with some embodiments of the present disclosure.

Referring to FIG. 2 and FIG. 3A to FIG. 3K, FIG. 2 is a flow chart showing a method 200 for fabricating the semiconductor device 100 in accordance with some embodiments of the present disclosure, and FIG. 3A to FIG. 3K are schematic three-dimensional diagrams and cross-sectional views of intermediate stages showing the method 200 for fabricating the semiconductor device in accordance with some embodiments of the present disclosure. In the method 200, at first, operation 210 is performed to provide the semiconductor substrate 110 with trenches 112 formed therein, as shown in FIG. 3A. The trenches 112 may be formed by using a masking layer (not shown) along with a suitable etching process. For example, the masking layer may be a hardmask including silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may alternatively be utilized. Once formed, the masking layer may be patterned through a suitable photolithographic process to expose those portions of the substrate 110 that will be removed to form the trenches 112.

Figure 3B:
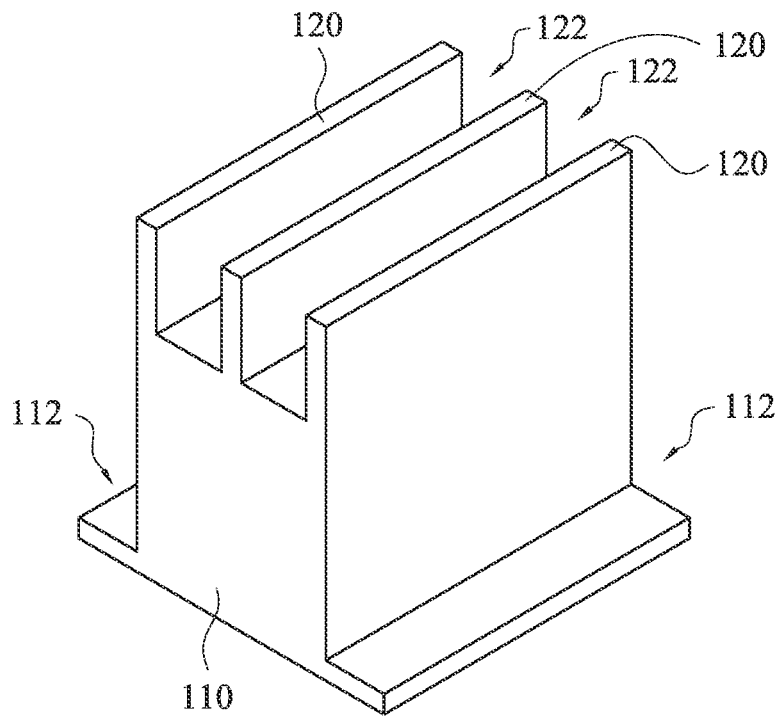

Then, operation 220 is performed to form the fins 120 along with trenches 122, as shown in FIG. 3B. The second trenches 122 are located between the trenches 112, and are intended to be intra-Fin isolation regions, such as isolation regions between separate fins 120 that share either a similar gate or similar sources or drains. The trenches 122 may be formed by using a similar process as the trenches 112, such as a suitable masking or photolithography process followed by an etching process. Additionally, the formation of the trenches 122 may also be used to deepen the trenches 112, such that the trenches 112 extend into the substrate 110 a further distance than the trenches 122.

Figure 3C:
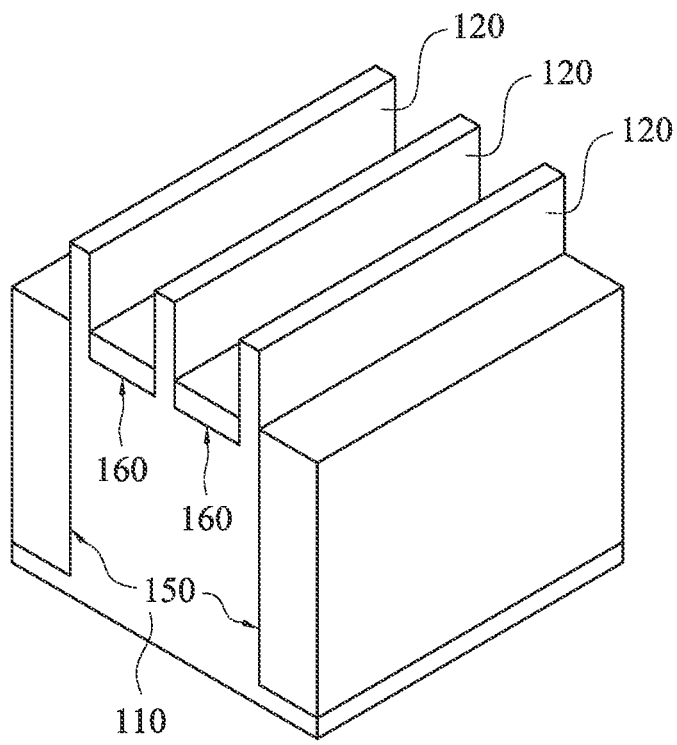

Thereafter, operation 230 is performed to fill the trenches 112 and trenches 122 with a dielectric material to form the isolation structures 150 and the intra-device isolation structures 160, as shown in FIG. 3C. The isolation structures 150 are located in the trenches 112, and the isolation structures 160 are located in the trenches 122. The dielectric material used to form the isolation structures 150 and 160 may be an oxide material, a high-density plasma (HDP) oxide, or the like. The isolation structures 150 and 160 may be formed, after an optional cleaning and lining of the trenches 112 and 122, using either a chemical vapor deposition (CVD) method (e.g., the HARP process), a high density plasma CVD method, or other suitable method of formation as is known in the art.

Figure 3D:
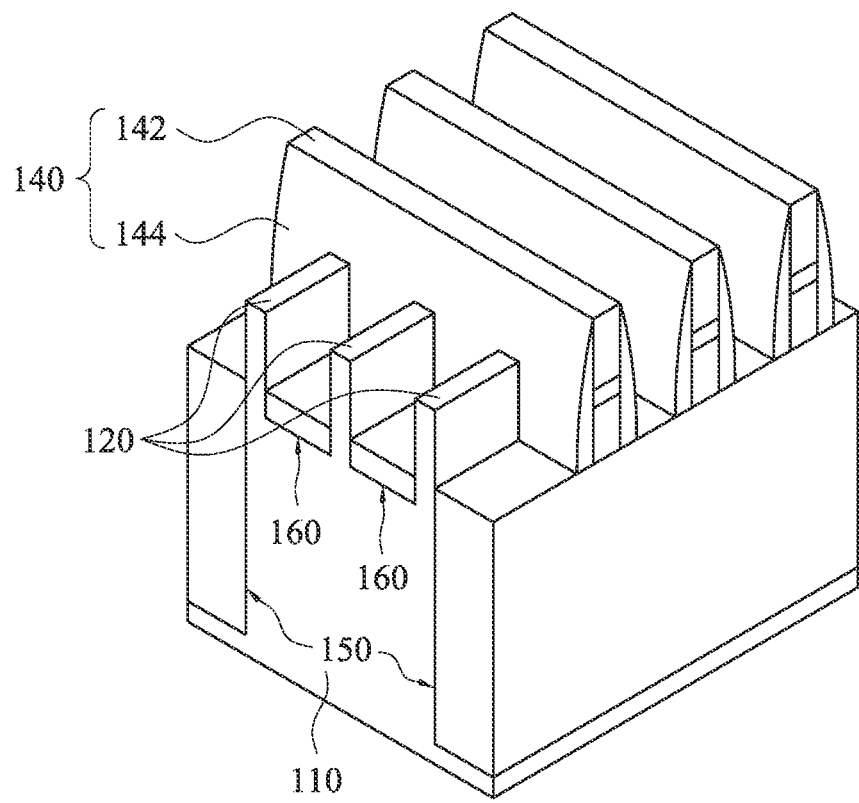

Then, operation 240 is performed to form the gate structures 140 including the gate electrode stack 142 and the spacer 144 on the fins 120, as shown in FIG. 3D. The gate dielectric layer 142b of the gate electrode stack 142 (as shown in FIG. 1B) may be formed by thermal oxidation, chemical vapor deposition, sputtering, or any other methods known and used in the art for forming a gate dielectric. The gate dielectric layer 142b of the gate electrode stack 142 may be formed from a high permittivity (high-k) material (e.g., with a relative permittivity greater than about 5) such as lanthanum oxide, aluminum oxide, hafnium oxide, hafnium oxynitride, or zirconium oxide, or combinations thereof. Additionally, any combination of silicon dioxide, silicon oxynitirde, and/or high-k materials may also be used for the gate dielectric layer 142b.

The gate electrode layer 142a of the gate electrode stack 142 (as shown in FIG. 1B) may be formed from a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc. The gate electrode layer 142a may be deposited by chemical vapor deposition (CVD), sputter deposition, or other techniques known and used in the art for depositing conductive materials.

The spacers 144 may be formed from a dielectric material, such as silicon nitride, silicon carbide, silicon oxynitride, other suitable materials, and/or combinations, but embodiments of the present disclosure are not limited thereto. The spacers 144 may be formed by methods utilized to form such a layer, such as chemical vapor deposition (CVD), plasma enhanced CVD, sputter, and other methods known in the art.

The top surface of the gate electrode layer 142a may have a non-planar top surface, and may be planarized prior to patterning of the gate electrode layer 142a. Ions may or may not be introduced into the gate electrode layer 142a at this point. Ions may be introduced, for example, by ion implantation techniques. Once formed, the gate electrode layer 142a and the gate dielectric layer 142b may be patterned to form a series of gate electrode stacks 142 over the fins 120. The gate electrode stacks 142 define multiple channel regions located in the fins 120 underneath the gate dielectric layer 142b. The gate electrode stack 142 may be formed by using, for example, deposition and photolithography techniques known in the art. A gate mask may incorporate commonly used masking materials, such as photoresist material, silicon oxide, silicon oxynitride, and/or silicon nitride, but the embodiments of the present disclosure are not limited thereto. The gate electrode layer 142a and the gate dielectric layer 142b may be etched using a dry etching process to form the patterned gate electrode stack 142. Once the gate electrode stacks 142 are patterned, the spacers 144 are formed. The spacers 144 may be formed on opposing sides of the gate electrode stacks 142. The spacers 144 are typically formed by blanket depositing a spacer layer (not shown) on the previously formed structure. The spacer layer may include SiN, oxynitride, SiC, SiON, oxide, and the like and may be formed by methods utilized to form such a layer, such as chemical vapor deposition (CVD), plasma enhanced CVD, sputter, and other methods known in the art. The spacer layer may include a different material with different etch characteristics than the dielectric material forming the isolation structures 150 and 160 so that the spacers 144 may be used as masks for forming the isolation structures 150 and 160 (described below with references to FIG. 3E). The spacers 144 may then be patterned, such as by one or more etchings operations to remove the spacer layer from the horizontal surfaces of the structure.

Figure 3E:
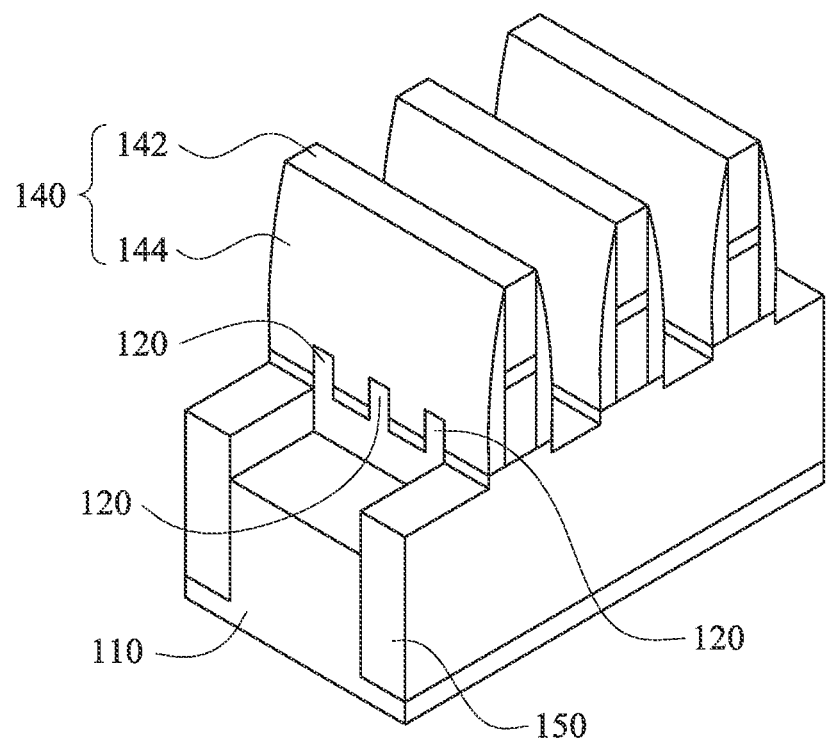

Thereafter, operation 250 is performed to remove portions of the fins 120 from those areas not covered by the gate structures 140, as shown in FIG. 3E. In an embodiment, portions of the isolation structures 150 are removed to deduce the height of the isolation structures 150, and portions of the isolation structures 160 are removed from those areas not protected by the gate structures 140, thereby forming exposed substrate areas for source/drain structures. In some embodiments, operation 250 may be performed by a reactive ion etch (RIE) by using the gate structures 140 as hardmasks, or by any other suitable removal process.

Figure 3F:
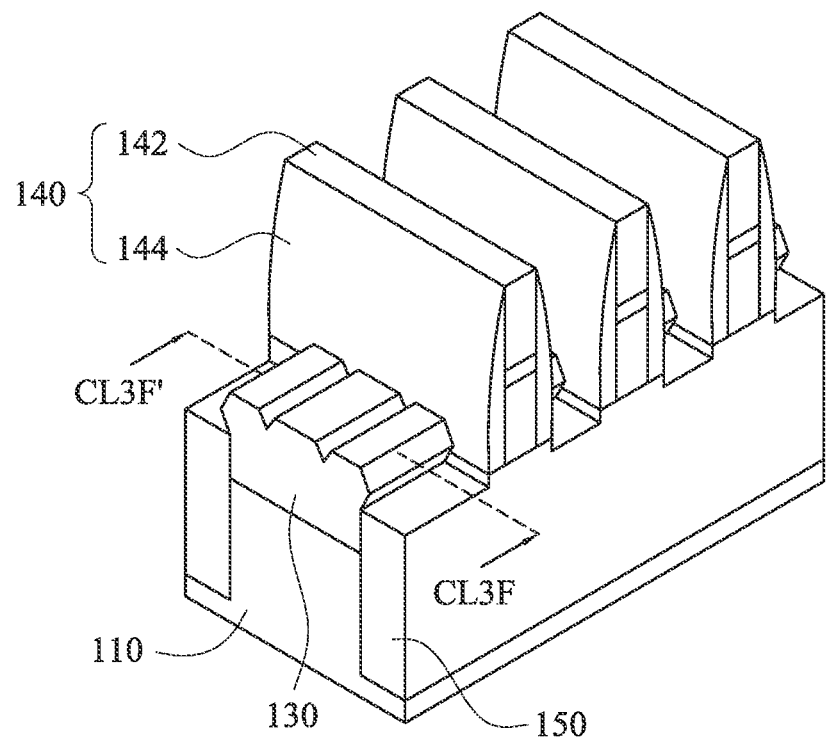
Figure 3G:
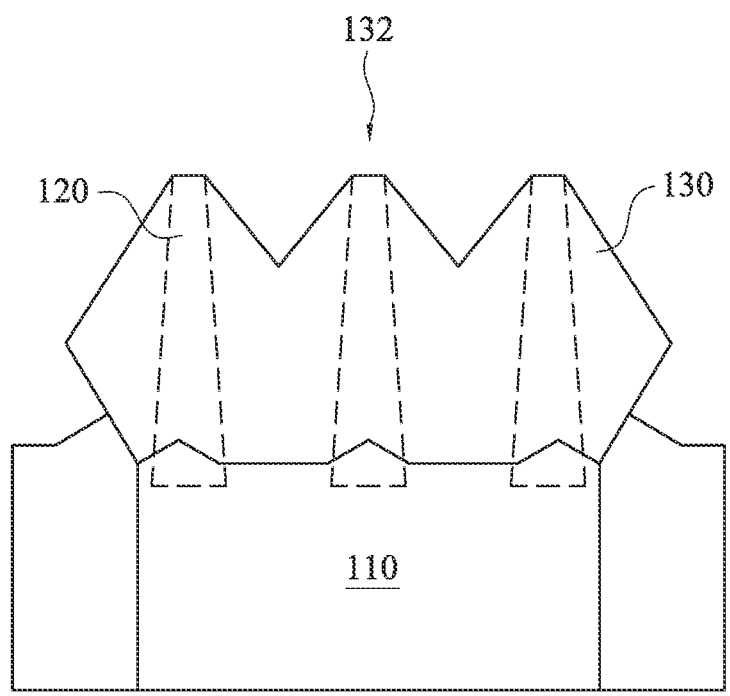

After operation 250, operation 260 is performed to form the source/drain structures 130 on the exposed substrate areas and enable the source/drain structures 130 to be connected to the fins 120, such as shown in FIG. 3F and FIG. 3G, in which FIG. 3G is a schematic cross-sectional view of the semiconductor device viewed along line CL3F-CL3F' in FIG. 3F. In some embodiments, each one of the source/drain structures 130 is epitaxially grown from a surface of semiconductor substrate 110 in accordance with a crystal direction <111> or <311> to form the top portion 132 with a W-shape cross section. However, the embodiments of the present disclosure are not limited thereto.

Figure 3H:
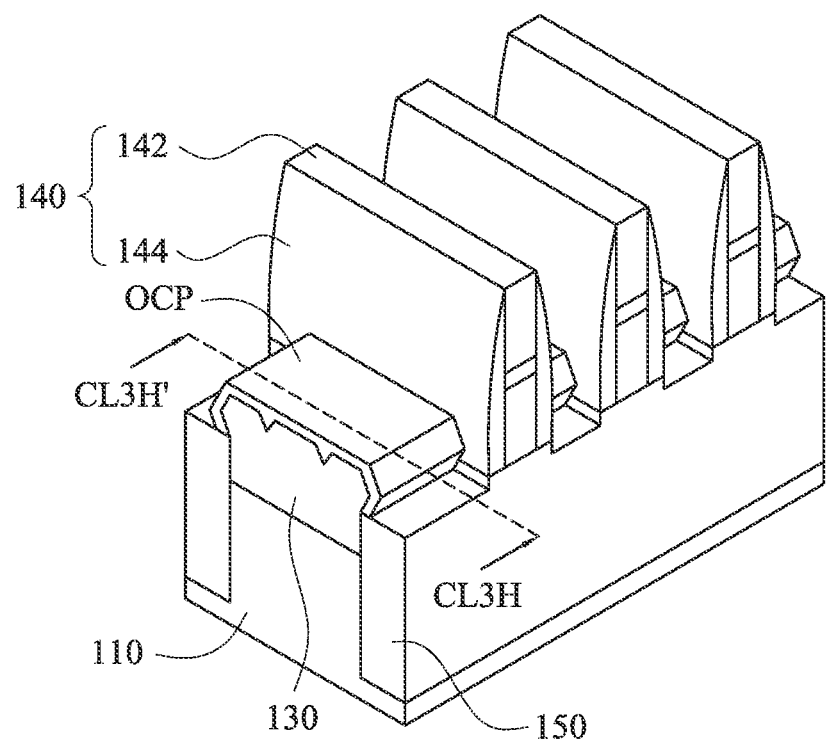
Figure 3I:
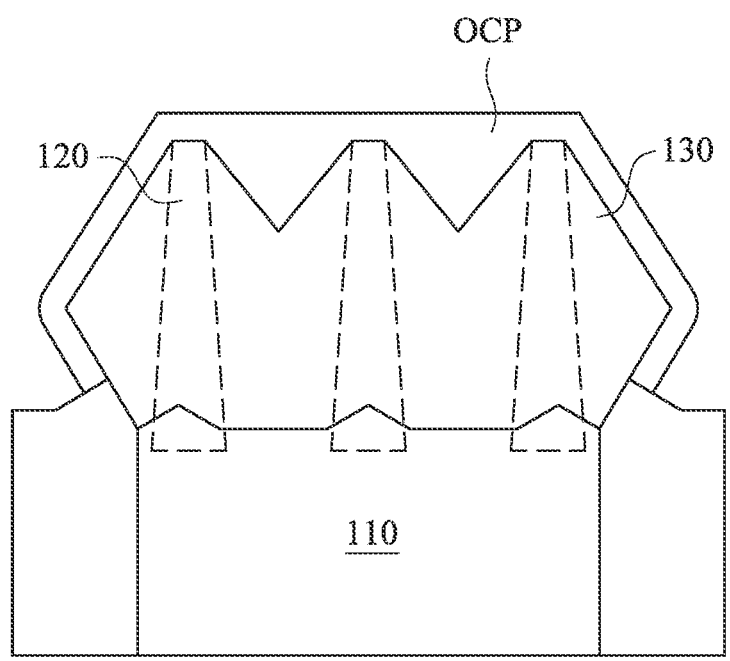

Thereafter, operation 270 is performed to form capping layers OCP to cover the entire source/drain structures 130, as shown in FIG. 3H and FIG. 3I, in which FIG. 3I is a schematic cross-sectional view of the semiconductor device viewed along line CL3H-CL3H' in FIG. 3H. The capping layers OCP are used to protect the source/drain structures 130 in subsequent operations.

Figure 3J:
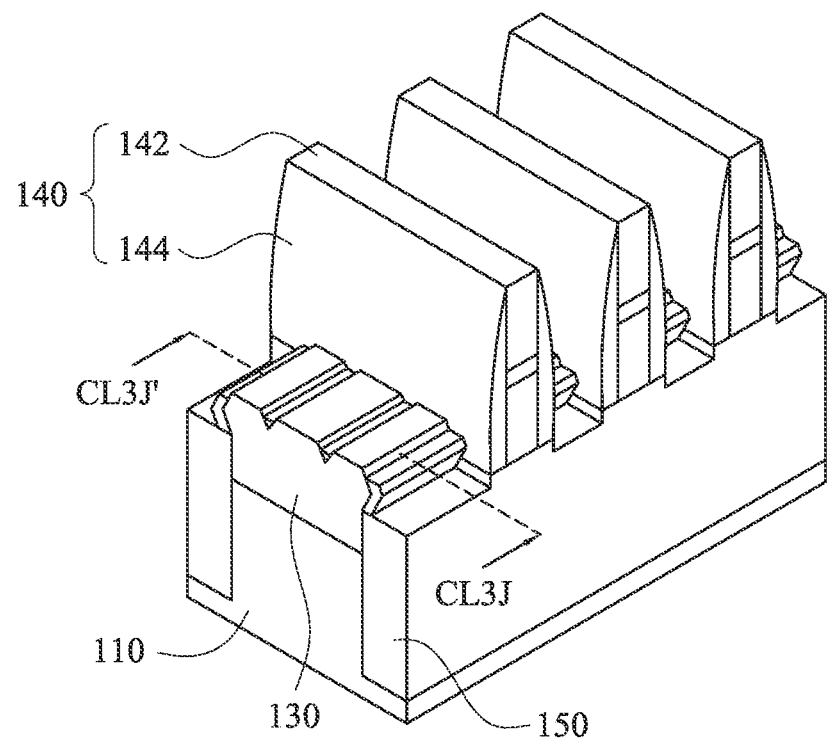
Figure 3K:
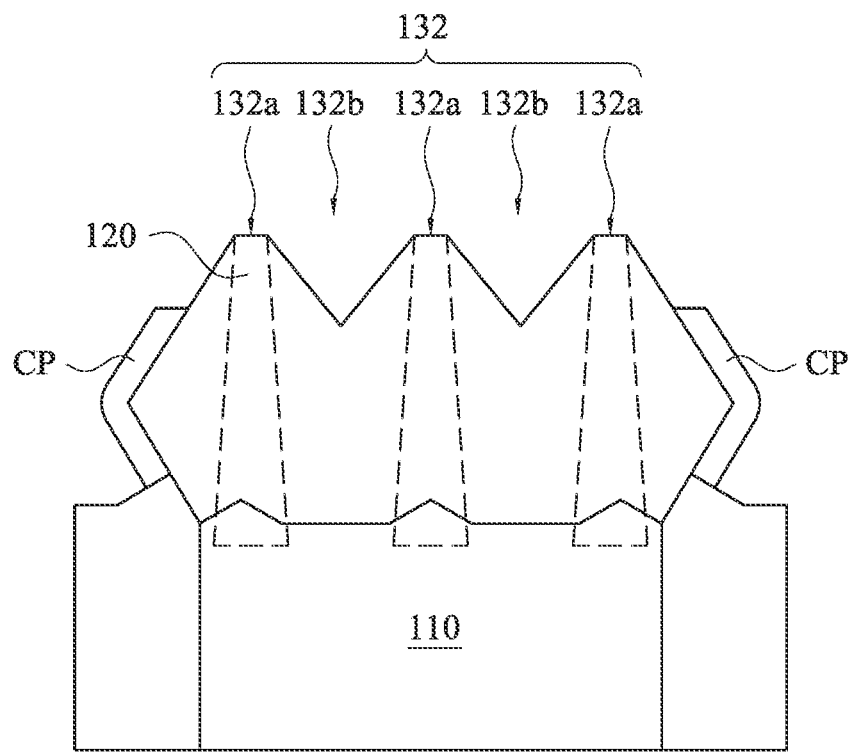

Then, operation 280 is performed to etch portions of the capping layers OCP to expose the top portion 132 of each of the source/drain structures 130, and portions of the capping layers CP on the sidewalls of each of the source/drain structures 130 are formed accordingly, as shown in FIG. 3J and FIG. 3K, in which FIG. 3K is a schematic cross-sectional view of the semiconductor device viewed along line CL3J-CL3J' in FIG. 3J.

Figure 3L:
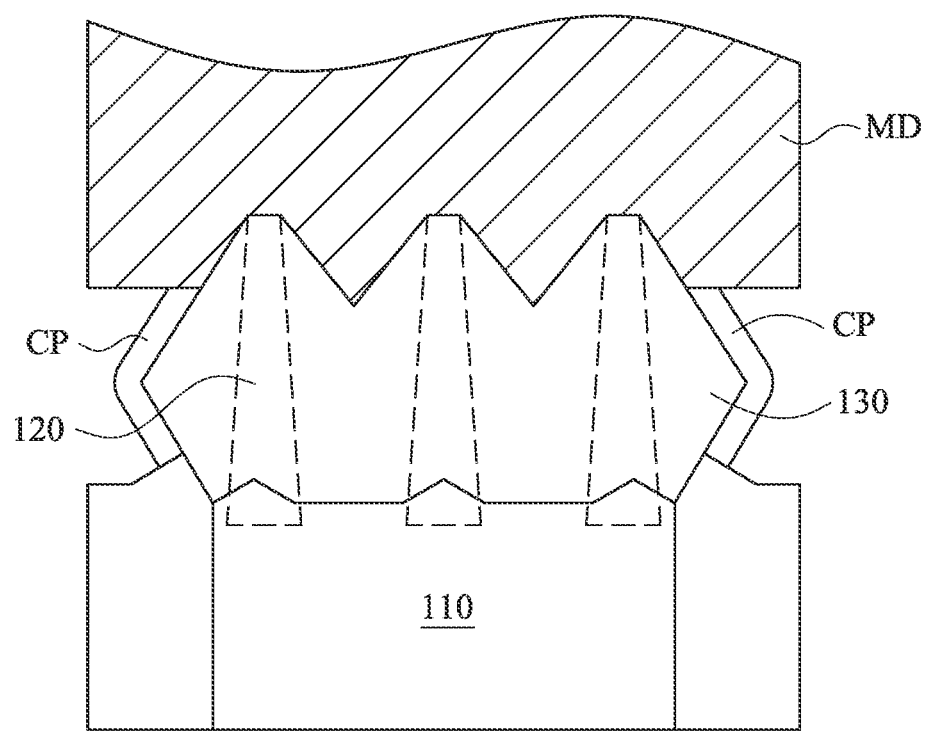
FIG. 3L is a schematic cross-sectional view of a semiconductor device connected with a metal landing in accordance with some embodiments of the present disclosure.

The exposed top portion 132 is used to provide a contact landing structure. Since the top portion 132 has a W-shape cross section, a contact area between a metal landing MD and the source/drain structure 130 is increased as shown in FIG. 3L, and resistance between the metal landing MD and the source/drain structure 130 is decreased accordingly. Further, since the source/drain structure 130 has the recessed portions 132b, a contact area between the spacer 144 of the gate structure 140 and the source/drain structure 130 is decreased, thereby improving a dislocation defect induced by the spacer 144.

Figure 4A:
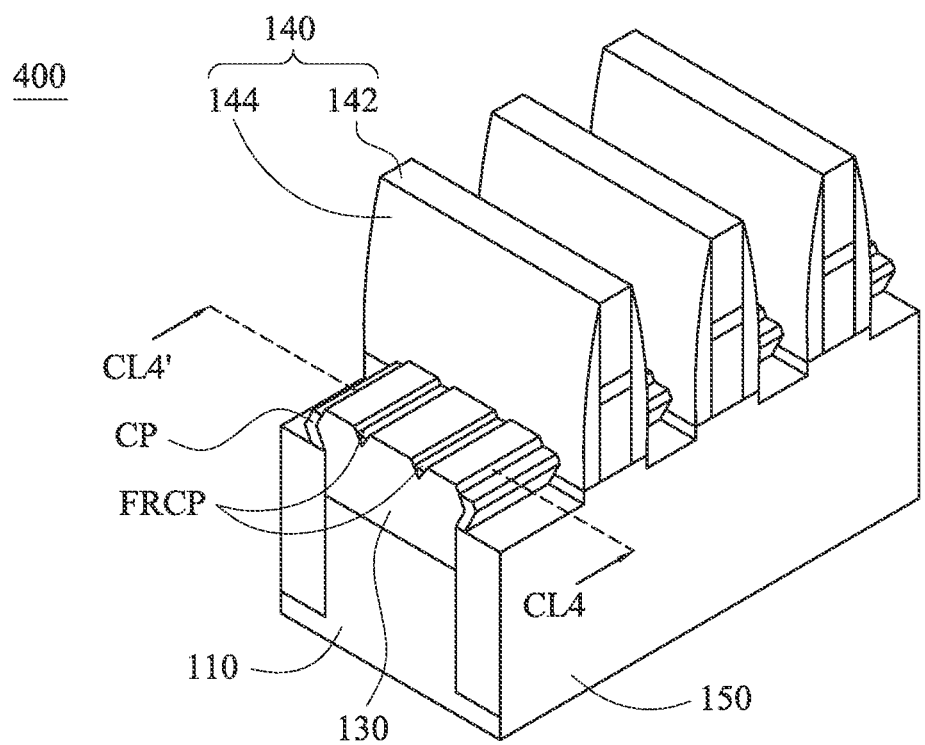
FIG. 4A is a schematic three-dimensional diagram showing a semiconductor device in accordance with some embodiments of the present disclosure.
Figure 4B:
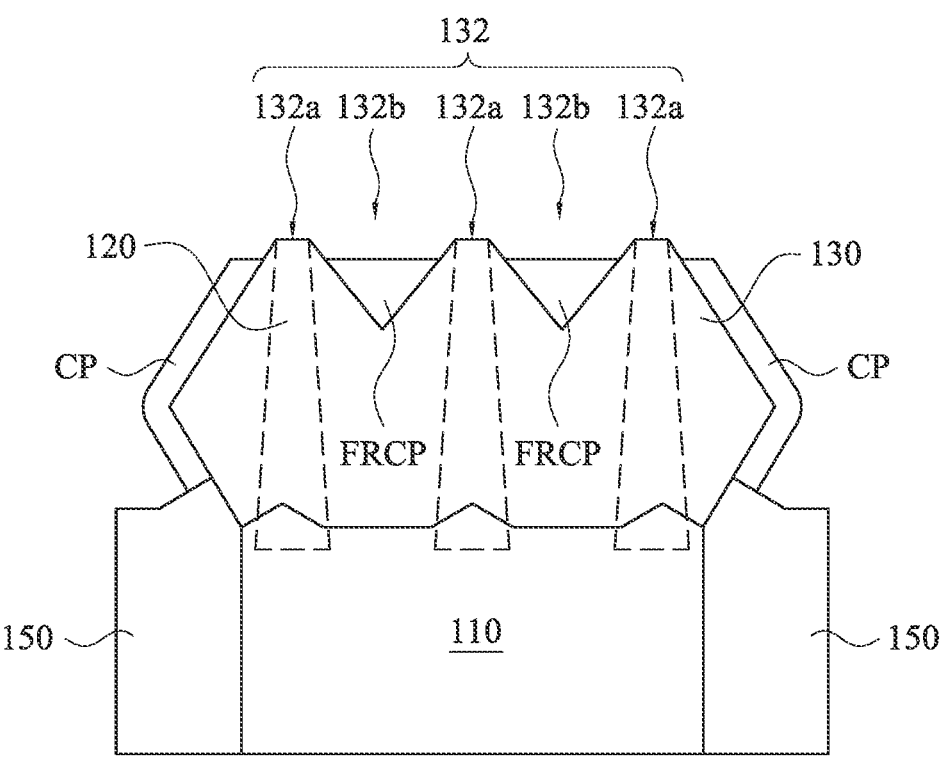
FIG. 4B is a schematic cross-sectional views of the semiconductor device viewed along line CL4-CL4' in FIG. 4A.
Figure 5:
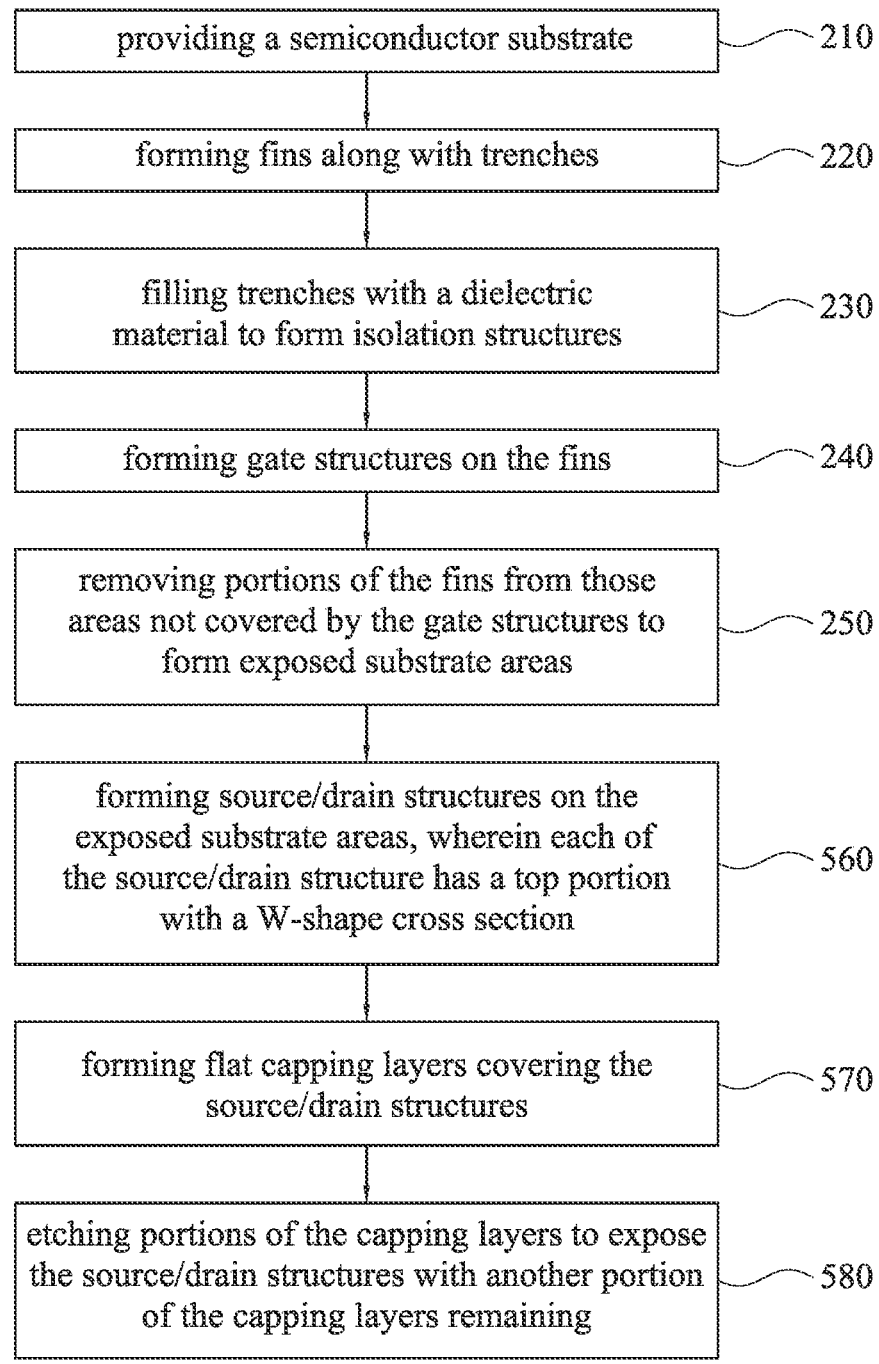
FIG. 5 is a flow chart showing a method for fabricating a semiconductor device in accordance with some embodiments of the present disclosure.

Referring to FIG. 4A and FIG. 4B, FIG. 4A is a schematic three-dimensional diagram showing a semiconductor device 400 in accordance with some embodiments of the present disclosure, and FIG. 4B is a schematic cross-sectional views of the semiconductor device 400 viewed along line CL4-CL4' in FIG. 4A. The semiconductor device 400 is similar to the semiconductor device 100, but the difference is in that the semiconductor device 400 further includes capping layers FRCP located on the surfaces of the source/drain structures 130. Specifically, the capping layers FRCP are located in the recessed portions 132b of the top portion 132 of each of the source/drain structures 130 for forming a contact landing structure as shown in FIG. 4B. Material of the capping layers FRCP is similar to that of the capping layers CP. For example, the capping layers FRCP include silicon germanium with a low germanium concentration, and are lightly boron-doped.

Figure 6A:
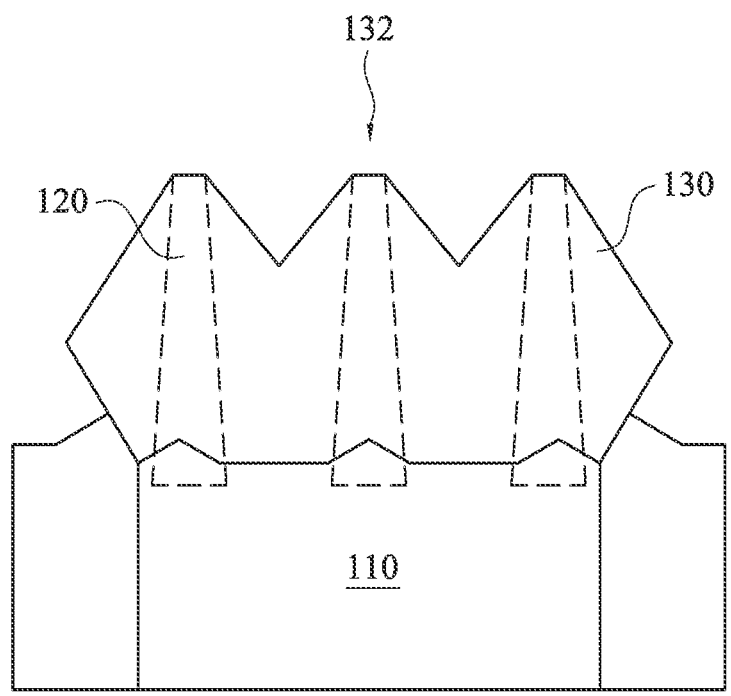
FIGS. 6A, 6B, and 6C are schematic cross-sectional views of intermediate stages showing a method for fabricating a semiconductor device in accordance with some embodiments of the present disclosure.
Figure 6B:
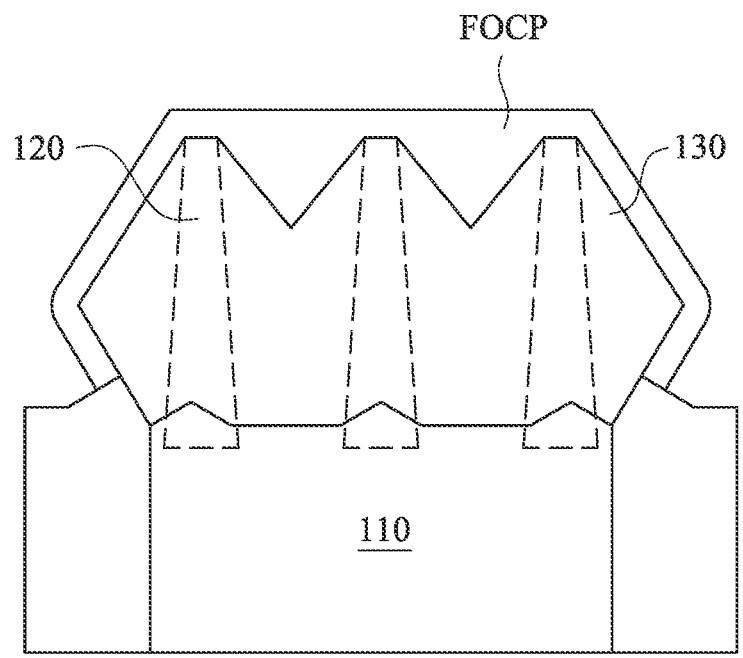
Figure 6C:
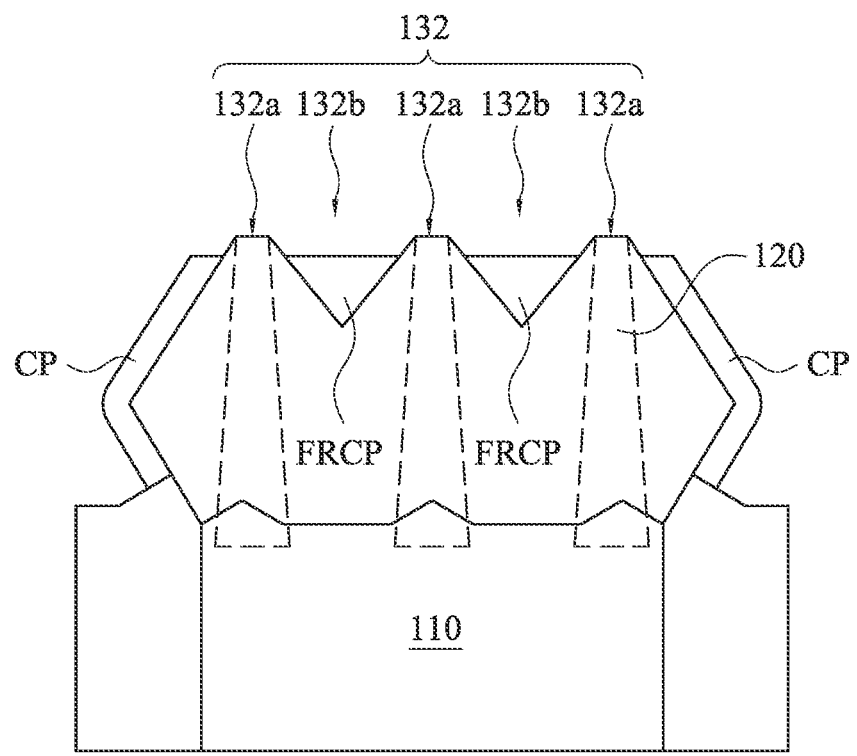

Referring to FIG. 5 and FIG. 6A to FIG. 6C, FIG. 5 is a flow chart showing a method 500 for fabricating the semiconductor device 400 in accordance with some embodiments of the present disclosure, and FIG. 6A to FIG. 6C are schematic cross-sectional views of intermediate stages showing a method for fabricating the semiconductor device in accordance with some embodiments of the present disclosure. In the method 500, at first, operation 210 is performed to provide the semiconductor substrate 110 with trenches 112 formed therein, as shown in FIG. 3A. Then, operation 220 is performed to form the fins 120 along with trenches 122, as shown in FIG. 3B. Thereafter, operation 230 is performed to fill the trenches 112 and trenches 122 with a dielectric material to form the isolation structures 150 and the intra-device isolation structures 160, as shown in FIG. 3C. Then, operation 240 is performed to form the gate structures 140 including the gate electrode stack 142 and the spacer 144 on the fins 120, as shown in FIG. 3D. Thereafter, operation 250 is performed to remove portions of the fins 120 from those areas not covered by the gate structures 140, as shown in FIG. 3E. Details of the operations 210-250 are described above, and thus are not described again herein.

After operation 250, operation 560 is performed to form the source/drain structures 130 and enable the source/drain structures 130 to be connected to the fins 120, such as shown in FIG. 6A. In some embodiments, the source/drain structures 130 are epitaxially grown from a surface of semiconductor substrate 110 in accordance with a crystal direction <111> to form the top portion 132 with a W-shape cross section. However, the embodiments of the present disclosure are not limited thereto. Thereafter, operation 570 is performed to form flat capping layers FOCP on the source/drain structures 130 to cover the source/drain structures 130, as shown in FIG. 6B. The flat capping layers FOCP cover the source/drain structures 130 and form flat top surfaces on the top portions 132 of the source/drain structures 130 to protect the source/drain structures 130 in subsequent operations. Then, operation 580 is performed to etch the capping layers FOCP to expose the top portions 132 of the source/drain structures 130. In operation 580, portions of the capping layers FOCP on the protrusive portions 132a are removed, but portions of the capping layers FOCP in the recessed portions 132b are slightly etched and remain, as shown in FIG. 6C. Therefore, the capping layers CP on the sidewalls of the source/drain structures 130 and the capping layers FRCP remaining in the recessed portions 132b of the source/drain structures 130 are formed accordingly.

Figure 6D:
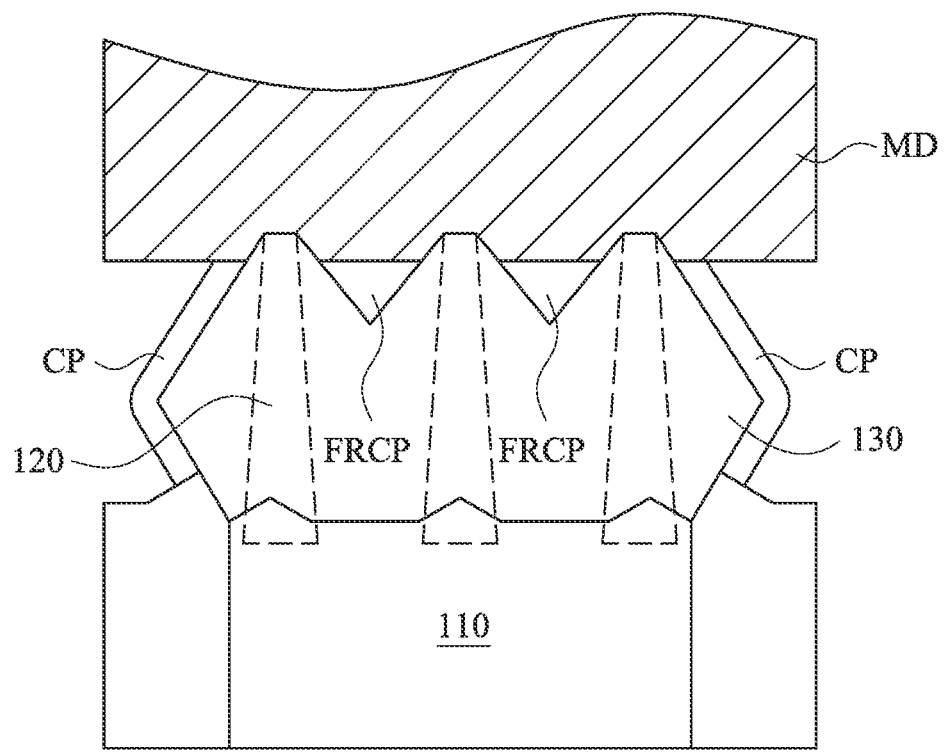
FIG. 6D is a schematic cross-sectional view of a semiconductor device connected with a metal landing in accordance with some embodiments of the present disclosure.

The exposed top portion 132 is used to provide a contact landing structure, such as shown in FIG. 6D. Compared with the semiconductor device 100, the semiconductor device 400 not only includes the source/drain structure 130 having the W-shape top portion 132, but also includes the capping layers FRCP in the recessed portions 132b of the source/drain structure 130. The capping layers FRCP in the recessed portions 132b can reduce Schottky barrier height (SBH) and resistance between the source/drain structures 130 and the metal landing MD.

Figure 7A:
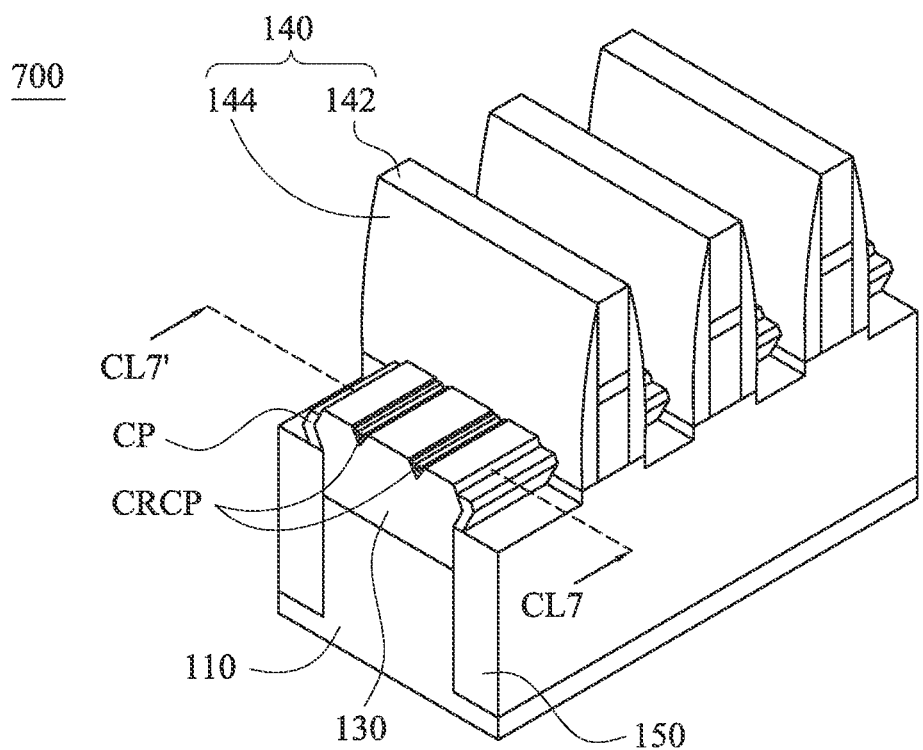
FIG. 7A is a schematic three-dimensional diagram showing a semiconductor device in accordance with some embodiments of the present disclosure.
Figure 7B:
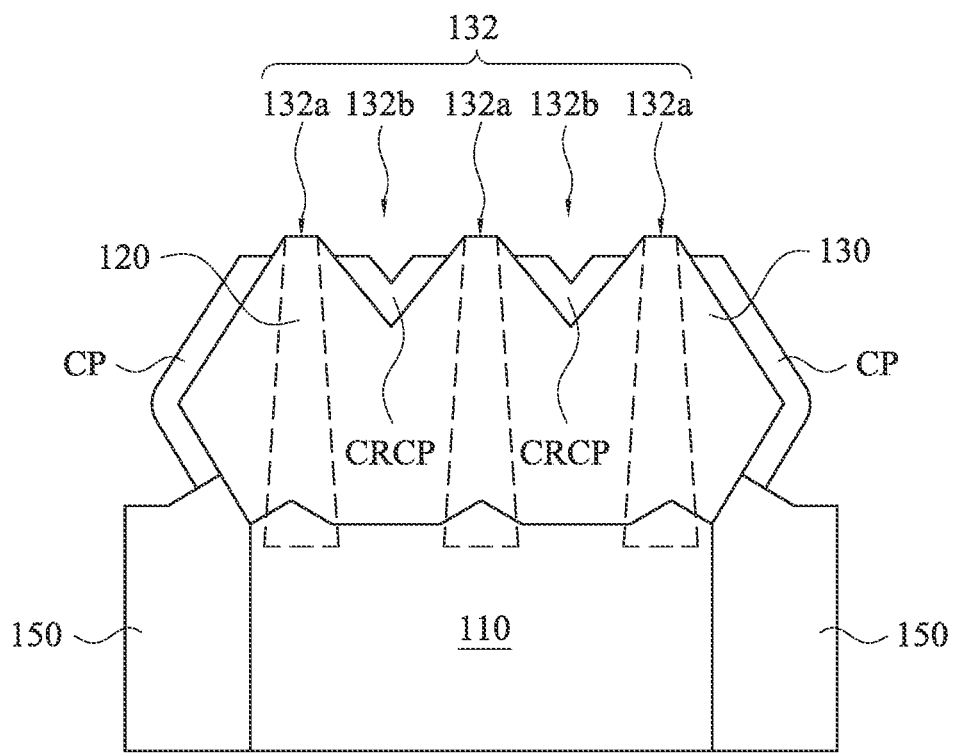
FIG. 7B is a schematic cross-sectional view of the semiconductor device viewed along line CL7-CL7' in FIG. 7A.
Figure 8:
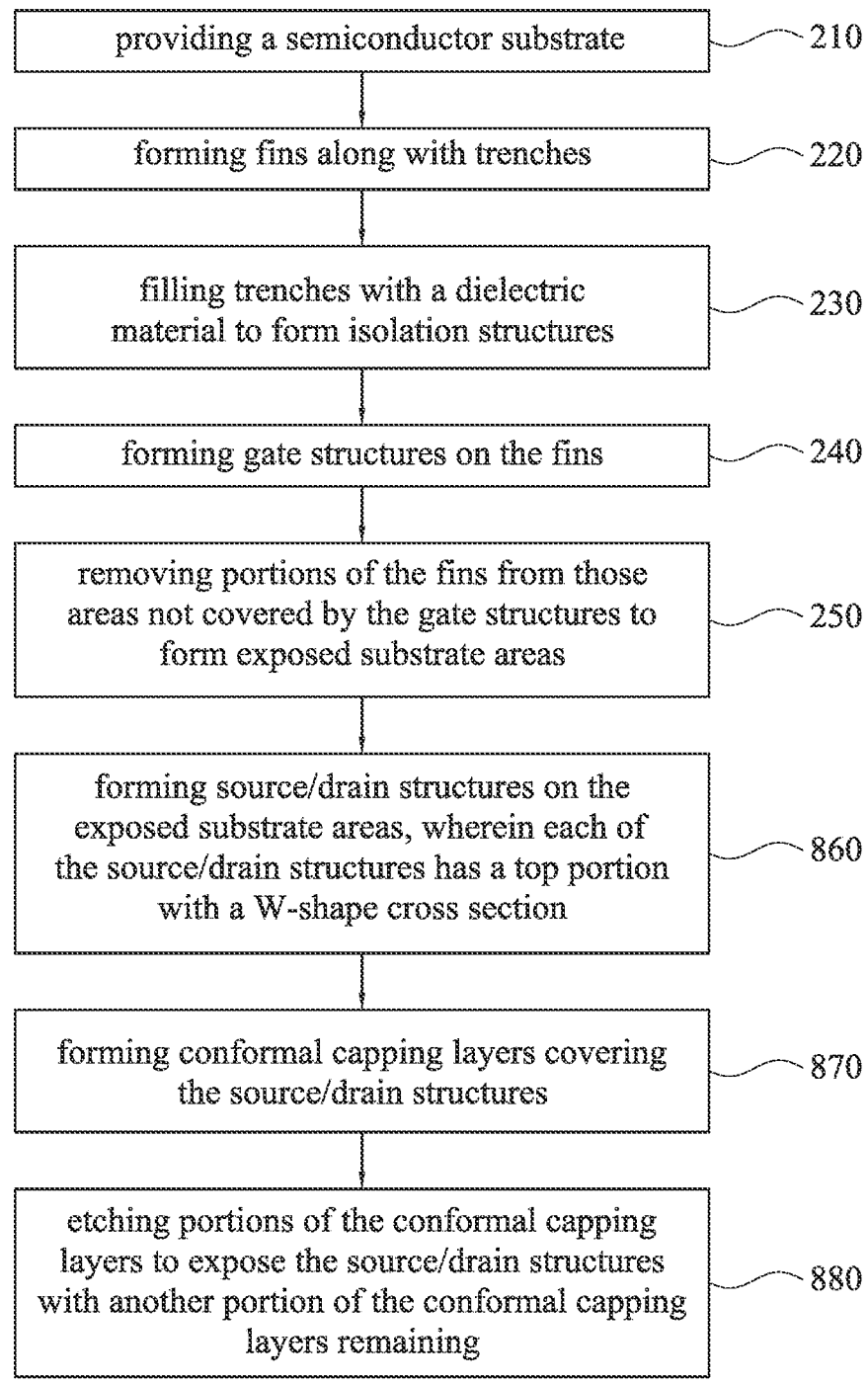
FIG. 8 is a flow chart showing a method for fabricating a semiconductor device in accordance with some embodiments of the present disclosure.

Referring to FIG. 7A and FIG. 7B, FIG. 7A is a schematic three-dimensional diagram showing a semiconductor device 700 in accordance with some embodiments of the present disclosure, and FIG. 7B is a schematic a cross-sectional views of the semiconductor device 700 along a cut line CL7-CL7' in FIG. 7A. The semiconductor device 700 is similar to the semiconductor device 100, but the difference is in that the semiconductor device 700 further includes capping layers CRCP located on the surface of the source/drain structures 130. Specifically, the capping layers CRCP are located in the recessed portions 132b of the top portion 132 of the source/drain structures 130 for forming a contact landing region as shown in FIG. 7B. Material of the capping layers CRCP is similar to that of the capping layers CP. For example, the capping layers CRCP include silicon germanium with a low germanium concentration, and are lightly boron-doped.

Figure 9A:
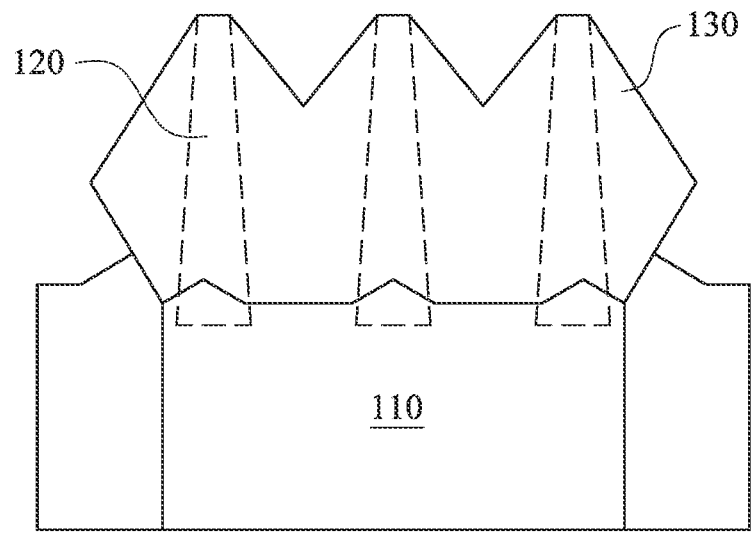
FIGS. 9A, 9B, and 9C are schematic cross-sectional views of intermediate stages showing a method for fabricating a semiconductor device in accordance with some embodiments of the present disclosure.
Figure 9B:
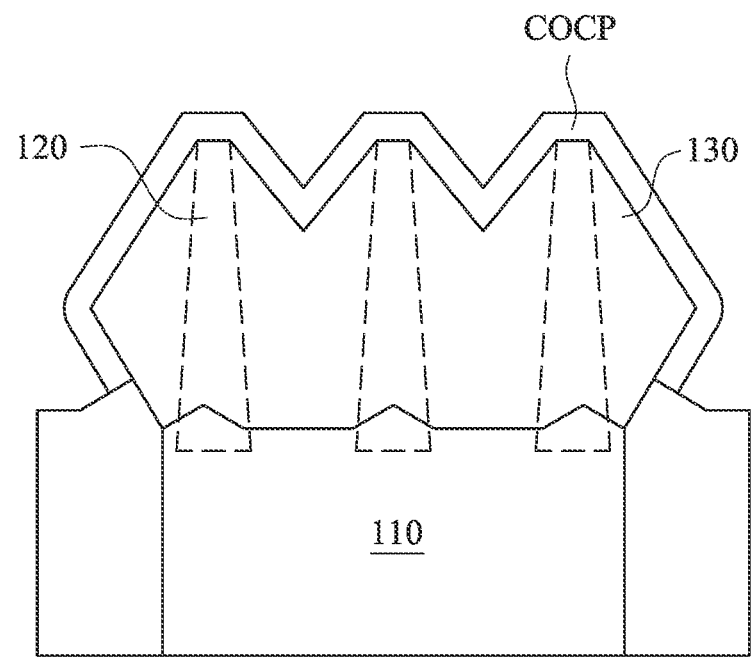
Figure 9C:
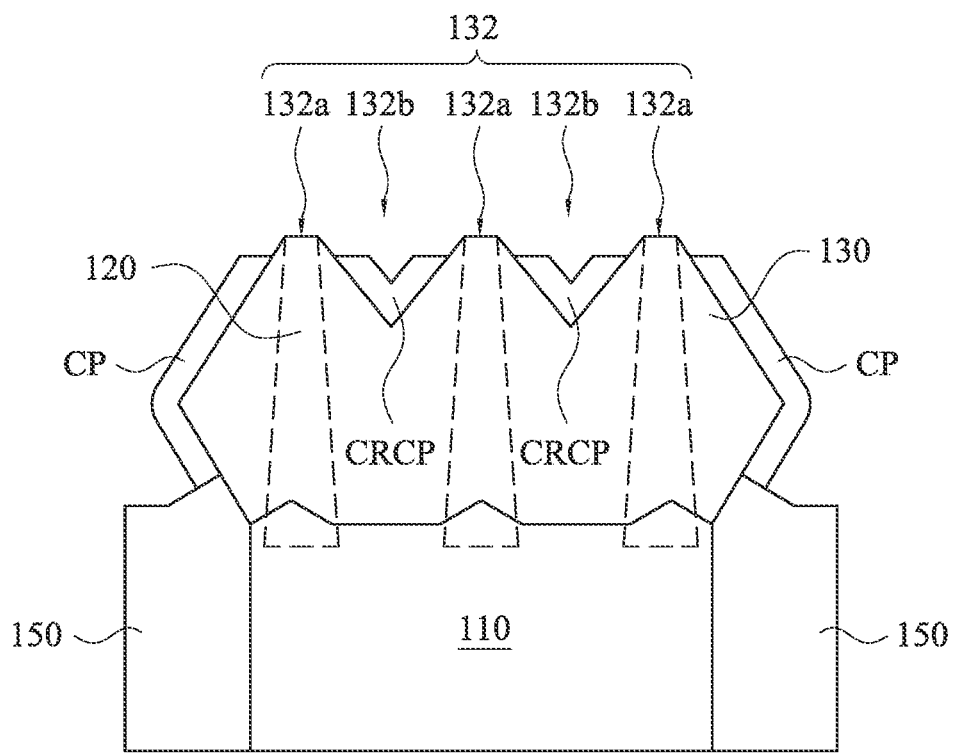

Referring to FIG. 8 and FIG. 9A to FIG. 9C, FIG. 8 is a flow chart showing a method 800 for fabricating the semiconductor device 700 in accordance with some embodiments of the present disclosure, and FIG. 9A to FIG. 9C are schematic cross-sectional views of intermediate stages showing a method for fabricating the semiconductor device in accordance with some embodiments of the present disclosure. In the method 800, at first, operation 210 is performed to provide the semiconductor substrate 110 with trenches 112 formed therein, as shown in FIG. 3A. Then, operation 220 is performed to form the fins 120 along with trenches 122, as shown in FIG. 3B. Thereafter, operation 230 is performed to fill the trenches 112 and trenches 122 with a dielectric material to form the isolation structures 150 and the intra-device isolation structures 160, as shown in FIG. 3C. Then, operation 240 is performed to form the gate structures 140 including the gate electrode stack 142 and the spacer 144 on the fins 120, as shown in FIG. 3D. Thereafter, operation 250 is performed to remove portions of the fins 120 from those areas not covered by the gate structures 140, as shown in FIG. 3E. Details of the operations 210-250 are described above, and thus are not described again herein.

After operation 250, operation 860 is performed to form the source/drain structures 130 and enable the source/drain structures 130 to be connected to the fins 120, as shown in FIG. 9A. In some embodiments, the source/drain structures 130 are epitaxially grown from a surface of semiconductor substrate 110 in accordance with a crystal direction <111> or <311> to form the top portion 132 with a W-shape cross section. However, the embodiments of the present disclosure are not limited thereto. Thereafter, operation 870 is performed to form capping layers COCP on the source/drain structures 130 to cover the source/drain structures 130, as shown in FIG. 9B. The capping layers COCP are conformal to the source/drain structures 130 and cover the source/drain structures 130 to protect the source/drain structures 130 in subsequent operations. Then, operation 880 is performed to etch the capping layers COCP to expose the top portions 132 of the source/drain structures 130. In operation 880, portions of the capping layers COCP on the protrusive portions 132a are removed, but portions of the capping layers COCP in the recessed portions 132b are slightly etched and remain, as shown in FIG. 9C. Therefore, the capping layers CP on the sidewalls of the source/drain structures 130 and the capping layers CRCP remaining in the recessed portions 132b of the source/drain structures 130 are formed accordingly.

Figure 9D:
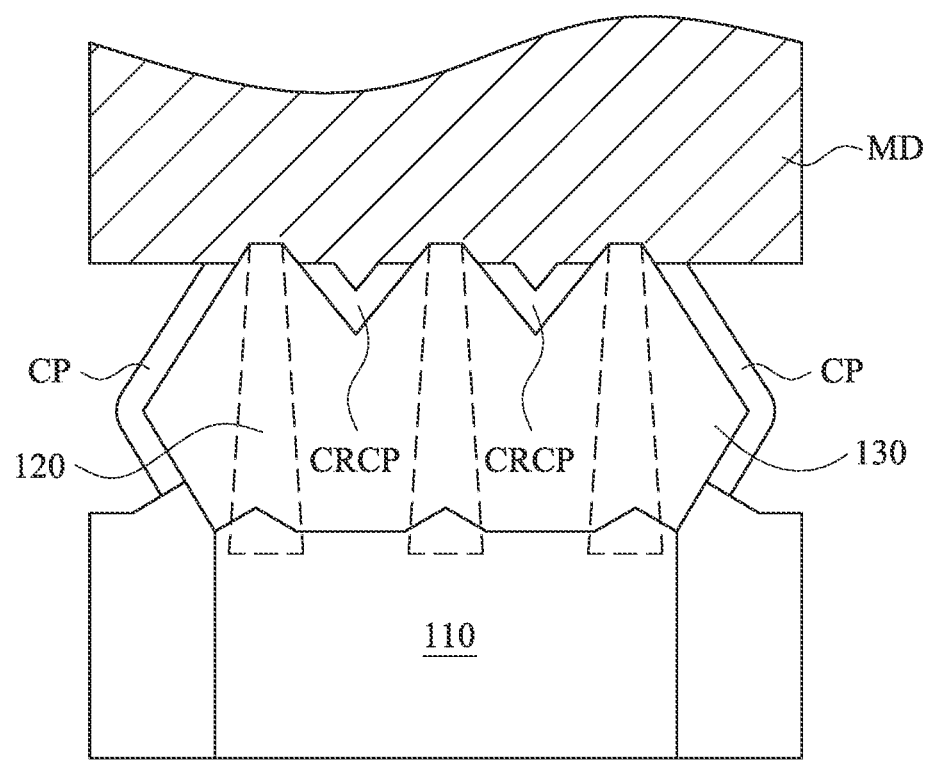
FIG. 9D is a schematic cross-sectional view of a semiconductor device connected with a metal landing in accordance with some embodiments of the present disclosure.

The exposed top portion 132 is used to provide a contact landing region, such as shown in FIG. 9D. Compared with the semiconductor device 400, the semiconductor device 700 includes the capping layers CRCP with V-shapes. The capping layers CRCP with V-shapes can increase a contact area between the capping layers CRCP and the metal landing MD, thereby reducing Schottky barrier height (SBH) and resistance between the source/drain structures 130 and the metal landing MD in advance.

According to some embodiments of the present disclosure, a semiconductor device includes a plurality of semiconductor fins, an epitaxy structure, a capping layer, and a contact. The epitaxy structure adjoins the semiconductor fins. The epitaxy structure has a plurality of protrusive portions. The capping layer is over a sidewall of the epitaxy structure. The contact is in contact with the epitaxy structure and the capping layer. The contact has a portion between the protrusive portions. The portion of the contact between the protrusive portions has a bottom in contact with the epitaxy structure.

According to some embodiments of the present disclosure, a semiconductor device includes a plurality of semiconductor fins, an epitaxy structure, a capping layer, and a contact. The epitaxy structure adjoins the semiconductor fins. The epitaxy structure has a W-shape cross section. The capping layer is conformal to a sidewall of the epitaxy structure. The capping layer is made of a semiconductor material. The contact is in contact with the epitaxy structure and the capping layer.

According to some embodiments of the present disclosure, a method includes etching a semiconductor substrate to form a plurality of semiconductor fins. The semiconductor fins are etched to form a recess. The epitaxy structure is grown in the recess. The epitaxy structure has a W-shape cross section. The capping layer is formed over the epitaxy structure. The capping layer is at least conformal to a sidewall of the epitaxy structure. The capping layer is etched to expose a top surface of the epitaxy structure. A first portion of the capping layer remains over the sidewall of the epitaxy structure after etching the capping layer. A contact is formed and is in contact with the exposed top surface of the epitaxy structure and the first portion of the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
an isolation structure laterally surrounding a portion of the substrate;
a source/drain epitaxial structure over the portion of the substrate, wherein the source/drain epitaxial structure has a wavy top surface profile, and wherein the source/drain epitaxial structure forms a non-linear interface with the portion of the substrate;
a capping layer lining a portion of the source/drain epitaxial structure, wherein the capping layer has a first portion in contact with a top surface of the isolation structure; and
a contact over and in contact with the source/drain epitaxy structure and the capping layer.

2. The device of claim 1, wherein a topmost end of the capping layer is lower than a topmost end of the source/drain epitaxial structure.

3. The device of claim 1, wherein the capping layer is made of a semiconductor material.

4. The device of claim 1, wherein the capping layer and the source/drain epitaxial structure are made of silicon germanium.

5. The device of claim 4, wherein the capping layer has a lower germanium concentration than the source/drain epitaxial structure.

6. The device of claim 1, wherein a second portion of the capping layer has an inverted triangular cross-sectional profile or a V-shape cross-sectional profile.

7. The device of claim 1, wherein the capping layer is a boron-doped capping layer.

8. The device of claim 1, wherein the contact forms a wavy interface with the source/drain epitaxial structure.

9. The device of claim 1, wherein the capping layer has a lower germanium concentration than the source/drain epitaxial structure.

10. The device of claim 1, wherein a second portion of the capping layer is disposed in a notch portion of the source/drain epitaxial structure.

11. The device of claim 1, further comprising a fin protruding from the portion of the substrate, wherein the source/drain epitaxial structure is connected to the fin.

12. A device, comprising:
a substrate;
an isolation structure within the substrate;
a source/drain epitaxial structure over and forming an interface with the substrate, wherein the source/drain epitaxy structure comprises a first protruding portion and a second protruding portion, and the interface extends continuously from a first position below the first protruding portion to a second position below the second protruding portion;
a contact over the source/drain epitaxy structure and having a portion extending into a region laterally between the first protruding portion and the second protruding portion;
a first semiconductive capping layer extending from a bottom surface of the contact, along a sidewall of the source/drain epitaxial structure, to a top surface of the isolation structure; and
a second semiconductive capping layer between the portion of the contact and the source/drain epitaxial structure, wherein the first semiconductive capping layer is spaced apart from the second semiconductive capping layer.

13. The device of claim 12, wherein the portion of the contact has an inverted triangular cross-sectional profile.

14. The device of claim 12, wherein the second semiconductive capping layer has an inverted triangular cross-sectional profile or a V-shape cross-sectional profile.

15. A device, comprising:
a substrate;
a source/drain epitaxial structure over the substrate and having a notch portion;
a boron-doped capping layer lining and in contact with a portion of the source/drain epitaxial structure; and
a contact over and in contact with the source/drain epitaxy structure and the boron-doped capping layer, wherein the contact has a portion that extends into the notch portion of the source/drain epitaxial structure.

16. The device of claim 15, wherein the portion of the contact fills an entirety of the notch portion of the source/drain epitaxial structure.

17. The device of claim 15, wherein the boron-doped capping layer lines the portion of the contact.

18. The device of claim 15, wherein the boron-doped capping layer has an inverted triangular cross-sectional profile or a V-shape cross-sectional profile.

19. The device of claim 15, wherein the boron-doped capping layer is made of silicon germanium.

20. The device of claim 15, wherein a thickness of the boron-doped capping layer is in a range from 2 nm to 10 nm.

* * * * *